United States Patent [19]

Schauerte

[11] Patent Number: 4,724,382

[45] Date of Patent: Feb. 9, 1988

[54] TESTING INSTRUMENT FOR DETECTLNG ALTERNATING VOLTAGES IN MAINS AND ALTERNATING ELECTROMAGNETIC FIELDS IN THE VICINITY OF VOLTAGE-CARRYING CONDUCTORS

[76] Inventor: Hubertus Schauerte, Am Selbend 34, 5948 Schmallenberg 1, Fed. Rep. of Germany

[21] Appl. No.: 786,518

[22] Filed: Oct. 11, 1985

[30] Foreign Application Priority Data

Oct. 11, 1984 [DE] Fed. Rep. of Germany ....... 3437320
Oct. 27, 1984 [DE] Fed. Rep. of Germany ....... 3439504

[51] Int. Cl.$^4$ ............................................. G01R 19/14
[52] U.S. Cl. .................................. 324/133; 324/72.5; 324/556
[58] Field of Search ......................... 324/133, 51, 72.5

[56] References Cited

U.S. PATENT DOCUMENTS

| | | | |
|---|---|---|---|
| 3,828,256 | 8/1974 | Liu | 324/133 |
| 4,006,409 | 2/1977 | Adams | 324/133 X |
| 4,027,236 | 5/1977 | Stewart | 324/133 X |

FOREIGN PATENT DOCUMENTS

| | | | |
|---|---|---|---|
| 0720336 | 2/1942 | Fed. Rep. of Germany | 324/133 |
| 0883011 | 7/1953 | Fed. Rep. of Germany | 324/133 |
| 7919462 | 11/1979 | Fed. Rep. of Germany | . |
| 3301154 | 7/1983 | Fed. Rep. of Germany | 324/133 |
| 3302509 | 3/1984 | Fed. Rep. of Germany | . |
| 3108974 | 5/1984 | Fed. Rep. of Germany | . |

Primary Examiner—Reinhard J. Eisenzopf
Assistant Examiner—Robert W. Mueller
Attorney, Agent, or Firm—Schwartz, Jeffery, Schwaab, Mack, Blumenthal & Evans

[57] ABSTRACT

An electrical measuring or testing instrument is disclosed for detecting alternating voltages in mains, induced voltages in ungrounded conductors, and alternating electrical fields in the vicinity of voltage-carrying conductors. The instrument includes a constant-voltage source, a test prod, which is connected via a protective resistor to the input of an amplification circuit and via a further resistor and a switching transistor to the negative pole of the constant-voltage source, and an LED connected to the constant-voltage source and controlled by the amplifier circuit. The amplifier circuit has a very high amplification factor, so that even weak alternating fields in the vicinity of voltage-carrying conductors can be detected. The amplification is normally reduced with the aid of a resistor connected between the input of the amplifier circuit and the negative pole of the voltage source. If higher amplification is required, the connection between the resistor and the constant-voltage source can be interrupted with the aid of a foil sensor.

13 Claims, 3 Drawing Figures

TESTING INSTRUMENT FOR DETECTLNG ALTERNATING VOLTAGES IN MAINS AND ALTERNATING ELECTROMAGNETIC FIELDS IN THE VICINITY OF VOLTAGE-CARRYING CONDUCTORS

BACKGROUND OF THE INVENTION

The present invention relates to an electric testing instrument and in particular and to an electric multi-purpose measuring instrument.

From German patent application No. DE-C1-33 02 509, a unipolar testing instrument having a flexible test prod and an LED display is known. This instrument can detect alternating voltages in mains and induced voltages in ungrounded conductors. The test prod of this conventional testing instrument is connected via a high-resistance protective resistor to the input of a Darlington amplifier circuit, the emitter of which is connected to the negative pole of a source of direct current, while the collector is connected via the LED and a current-limiting resistor to the positive pole of the voltage source. In this manner, even relatively weak induced voltages can be indicated by the lighting up of the LED, yet grounding of the testing instrument is not required. The input of the amplifier circuit is also connected via a resistor and a switching transistor to the negative pole of the voltage source. The base of the switching transistor is triggered by a square-wave generator, so that the switching transistor is periodically blocked and switched through. When the switching transistor is switched through, the amplification is decreased to such an extent that the LED lights up only when the full alternating voltage in the main is applied. Relatively weak ripple voltages are therefore indicated by a blinking LED display in the rhythm of the square-wave generator, while the a full alternating voltage in the main is indicated by a continuously illuminated LED. In this way the two types of voltage can be distinguished from one another without having to manually switch from one type of testing instrument sensitivity to another.

With the aid of the conventional testing instrument, alternating electromagnetic fields in the vicinity of voltage-carrying conductors can also be detected. This has the advantage that the test prod can be passed along the outside of the insulation on a conductor, and the voltage-carrying sections of the conductor's length can be identified. In this manner it is very simple to locate any breaks in an electrical line.

To detect electrical fields of this kind, the flexible test prod must be wound one or more times around the conductor, in order to assure sufficient coupling and so that a detectable voltage will be generated in the test prod. This has the advantage that it is relatively complicated to detect the alternating fields. Nor can this disadvantage be overcome, in the conventional testing instrument, by increasing its sensitivity, because in that case the amount of reduction in amplification engendered by the switching transistor cannot be regulated precisely enough to assure that a clear distinction between alternating voltage in the mains and induced voltages can be made.

From German patent application No. DE-C2-31 08 974, a similar testing instrument is also known, in which instead of the switching transistor, a contact electrode is provided. The contact electrode is grounded by the human body in order to reduce the amplification. This prior art, however, has the same disadvantage as the above-described testing instrument.

On the other hand, so-called multi-purpose measuring instruments having two test prods are known, which enable quantitative measurement of voltages, currents, and resistances in different sensitivity ranges. With such multi-purpose measuring instruments, it is presently impossible, as a rule, to detect breakage in voltage-carrying conductors by scanning the electrical fields in the vicinity of the conductor.

SUMMARY OF THE INVENTION

One object of the present invention is to provide a widely applicable measuring or testing instrument which is simple to operate and with which electric alternating fields in the vicinity of voltage-carrying conductors can be effortlessly detected.

Another object of the present invention is to provide a measuring or testing instrument which is embodied in a screwdriver such that the instrument performs a dual function.

A further object of the present invention is to provide a measuring or testing instrument which is durable and effective in use and which will not subject the use to any large currents.

The testing instrument includes a constant-voltage source, a test prod which is connected via a protective resistor to the input of an amplifier circuit and, to reduce the amplification, to ground via a resistor and a switching transistor, and an LED connected to the direct-voltage source and controlled by the amplifier circuit. The testing instrument is embodied as a screwdriver, the blade of which forms the test prod and the handle of which accommodates the electric circuit and the direct-voltage source. The base of the switching transistor is triggered by means of a sensor such that when the sensor is actuated, the switching transistor blocks.

In accordance with other aspects of the invention, the switching transistor is an n-p-n transistor, the emitter of which is connected directly to ground and the base of which is continuously connected through a resistor to a positive pole of the voltage source and is connectable to ground through the sensor and a further resistor.

Also, a contact electrode may be connected to the constant-voltage source. Further, a Zener diode may be disposed between the constant-voltage source and the contact electrode with the blocking voltage of the Zener diode being lower than the voltage of the constant-voltage source. The contact electrode may be disposed immediately adjacent the sensor, or may be disposed on the sensor. The sensor may be a foil sensor.

The amplification factor of the amplifier circuit, when the sensor is closed, is at least $10^6$.

In accordance with further aspects of the invention, the instrument has a constant-voltage source, a housing having an interior and an outer wall, and a device for detecting alternating electromagnetic fields. The device includes a copper plate disposed in the interior of the multi-purpose measuring instrument on the outer wall of the housing. An amplifier circuit is connected to the copper plate via a high input resistor. The amplifier has an amplification factor of at least $10^6$. An LED is connected to the constant-voltage source of the measuring instrument.

BRIEF DESCRIPTION OF THE DRAWINGS

A preferred embodiment of the invention will now be described in further detail, referring to the drawings.

DETAILED DESCRIPTION OF THE PREFERRED EMBODIMENTS

In the testing instrument according to the invention, sensitivity is so sharply reduced in the normal state (amplification factor=approximately $10^4$) that only alternating voltages in mains are detected. The instrument can therefore be used like a conventional phase tester embodied as a screwdriver. However, if a sensor is actuated, the full amplification of the amplification circuit is available. In this case, the amplification factor is at least $10^6$ and preferably $10^7$. This amplification is so great that even weak alternating fields in the vicinity of voltage-carrying conductors can be detected without having to wrap the test prod around the conductor. The test prod is therefore embodied as a rigid screwdriver blade.

Preferably, a contact electrode is disposed on or beside the sensor, connected to the positive pole of the constant-voltage source and making continuity testing possible. In continuity testing, a battery test is performed at the same time, and because the amplification factor of the amplification circuit is continuously reduced to approximately $10^4$, resistances above 10 megohm are no longer indicated as a continuity. If the contact electrode makes contact during continuity testing, the amplification factor ($10^4$) does not increase. The amplification factor is raised to approximately $10^5$ only in response to externally-supplied alternating voltages, because as a result of the connection to ground via the human body, there is a greater potential drop between the input and the emitter of the amplification circuit. Because of the higher amplification ($10^5$), ripple voltages such as those which appear in ungrounded conductors can then be indicated.

The multi-purpose electric measuring instrument may also include a device for detecting alternating electrical fields. This device includes a copper plate 13 (see FIG. 3) disposed in the interior of the multipurpose measuring instrument on an outer housing wall, an amplifier circuit which is connected to the copper plate via a high input resistance and which has an amplification factor of at least $10^6$, and and LED connected to the direct-voltage source of the measuring instrument and controlled by the amplifier circuit.

The copper plate 13 serves as a sensor for receiving alternating electrical fields. The multi-purpose measuring instrument according to the invention thus makes possible not only quantitative measurements of current, voltage, and resistance, but qualitative detection of weak electromagnetic alternating fields as well when the measuring instrument is guided along a voltage-carrying conductor. By making extensive use of components already present in the measuring instrument, this additional function can be realized at little structural expense. In this embodiment of the invention, it is not necessary to reduce the amplification factor, because alternating voltages in mains can be detected in the usual manner by quantitative voltage measurement.

Figure 1:
FIG. 1 is perspective view of one side of a testing instrument according to the invention.
Figure 2:
FIG. 2 is a perspective view of an opposite side of the testing instrument.

Preferably, the multi-purpose measuring instrument is also provided with a contact or ground 17 electrode, (see FIG. 2) in order to simplify the grounding of the instrument while alternating fields are being detected.

In all the embodiments of the invention, an acoustic signal can be selected for use instead of the LED.

As shown in the Figures, the testing instrument 10 according to the invention includes a test prod 12, embodied as a screwdriver blade, and a handle 14, which has in its interior a battery compartment 16 and a compartment 18 for the electrical components of a circuit. An LED 20, a contact electrode 22, and a foil sensor 24 are disposed on one side face of the handle 14. The foil sensor 24 and the contact electrode 22 are close by one another, so that when the foil sensor is actuated the contact electrode can be contacted conveniently as well.

The battery compartment 16 accepts a constant-voltage source, such as a battery 26, which serves to supply voltage to the electrical circuit accommodated in the electrical component compartment 18.

Figure 3:
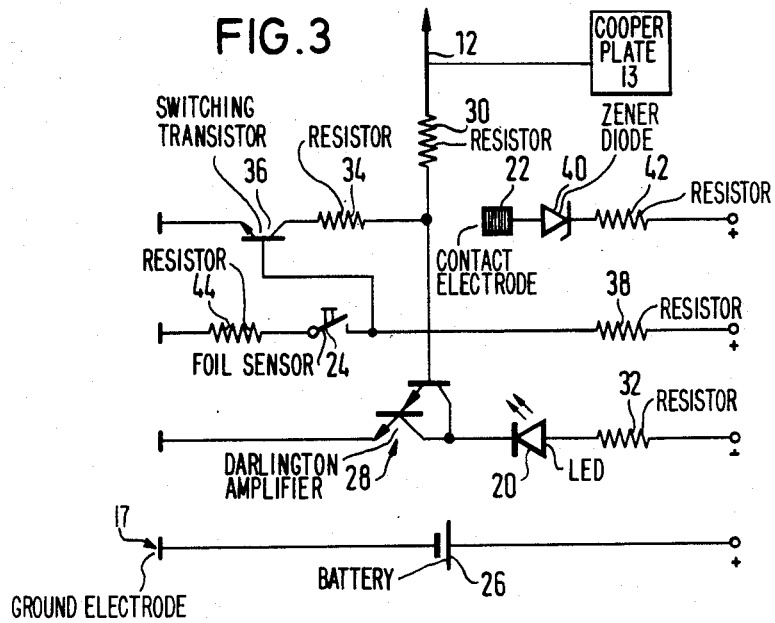
FIG. 3 is a circuit diagram for the testing instrument of FIGS. 1 and 2.

As shown in FIG. 3, the electrical circuit includes a Darlington amplifier circuit 28, the input of which is connected via a protective resistor 30 to the test prod 12. The emitter of the amplifier circuit 28 is connected to ground, that is, to the negative pole of the battery 26. The positive pole of the battery is connected to the collector of the amplifier circuit 28 via a currentlimiting resistor 32 and the LED 20.

The input of the amplifier circuit 28 is connected to ground via a resistor 34 and a switching transistor 36. The base of the switching transistor 36 is connected to the positive pole of the battery 26 via a high-resistance base resistor 38. The base can furthermore be connected to ground by the foil sensor 24 via a resistor 44.

The contact electrode 22 is connected via a Zener diode 40 and a resistor 42 to the positive pole of the battery.

The mode of operation of the above-described testing instrument will be explained below.

If an alternating voltage of 200 volts in the mains is applied to the test prod 12, then the amplifier circuit 28 is triggered by the positive half-waves of the alternating voltage, and a collector current, limited by the resistor 32, flows, causing the LED 20 to light up. If the user holds the handle 14 of the testing instrument in his hand, the capacitive coupling is so high that it is not necessary to ground the testing instrument in order to detect alternating voltages in the mains.

The switching transistor 36 is triggered positively via the base resistor 38 and is therefore continuously conductive. The input voltage of the amplifier circuit is therefore partially divided through the resistor 34, with the overall result that amplification is reduced. As long as the user does not touch the contact electrode 22, ripple voltages such as those generated in ungrounded lines are accordingly not amplified sufficiently, and so the LED 20 remains dark when such voltages are being scanned.

Such ripple voltage can be detected, however, if the user touches the contact electrode 22, because in that case there is a greater potential drop between the input and the emitter of the amplifier circuit. The resistance value of the protective resistor 30 is approximately 10 megohm. As a result of the action of this protective resistor, of the likewise very high-resistance resistor 42, and of the Zener diode 40, the current flowing through the contact electrode and the human body is limited to a very low value. The testing instrument according to the invention can accordingly be used safely even by persons wearing pacemakers, who are for that reason particularly sensitive to electrical currents in their body.

To detect alternating fields in the vicinity of voltage-carrying conductors, the foil sensor 24 is actuated, so that the base of the switching transistor 36 is triggered via a voltage divider circuit formed by the resistors 38 and 44. Since the resistor 44 has a low resistance value in comparison to resistor 38, the base in this instance receives a low potential, and the switching transistor 36 blocks. Under these conditions, the result is a high total amplification, corresponding to the high amplification factor of the amplifier circuit 28. If the contact electrode 22 is touched simultaneously with the actuation of the foil sensor 24, then the testing instrument exhibits maximum sensitivity, and even minimal voltages can be detected. A slight voltage drop across resistor 44 and the p-n junction of the switching transistor 36 causes the input of the amplifier circuit 28 to be slightly positively biased. This helps to increase the sensitivity of the testing instrument.

The testing instrument according to the invention can be used for continuity testing either with reduced or unreduced amplification. To this end, the user touches one electrode of the component whose continuity is to be tested with his hand, and he touches the other electrode with the test prod 12 while touching the contact electrode 22 with his hand. The lighting up of the LED 20 indicates that a current is flowing from the positive pole of the battery 26 through the contact electrode 22, the human body, the component to be tested, and the test prod 12 to the negative pole of the battery 26. If the foil sensor 24 is open, then, because of the low sensitivity, a contact test can be performed in such a manner that resistances of more than 10 megohm are no longer indicated as a continuity. The testing instrument is therefore particularly well suited for function testing of semiconductor components. On the other hand, by actuating the foil sensor, sensitivity during continuity testing can be increased considerably, so that a capacitor test, for instance, can be performed by sensing the slight charge currents.

In the testing instrument according to the invention, it is extremely desirable for safety reasons that it be possible to test the charge status of the battery 26. The user can perform a battery test of this kind simply by touching the contact electrode 22 and the test prod 12 simultaneously. If the battery 26 is functional, then the LED 20 lights up. If the output of the battery 26 drops, however, then the voltage drop across the Zener diode 40 dips below the blocking voltage, interrupting the flow of current, and the LED 20 no longer lights up during continuity testing, while a full display is still assured when testing for alternating voltage in mains.

What is claimed is:

1. A testing instrument for detecting alternating voltages in mains and alternating electromagnetic alternating fields in the vicinity of voltage-carrying conductors, comprising:

a constant-voltage source;
   an amplifier circuit;
   a test prod connected to an input of said amplifier circuit through a protective resistor;
   an amplification reducing circuit connected to said test prod, comprising a resistor and a switching transistor for connecting said test prod to ground through said resistor, when actuated, and means for actuating said switching transistor;
   an LED connected to the constant-voltage source and controlled by the amplifier circuit;
   wherein the testing instrument is a screwdriver having a blade which forms the test prod and having a handle which receives said constant-voltage source, said amplifier circuit, said protective resistor, and said amplification reducing circuit and wherein said switching transistor is actuatable by a sensor in such a manner that the switching transistor blocks when the sensor is actuated.

2. A testing instrument as defined by claim 1, wherein the switching transistor is an n-p-n transistor, the emitter of which is connected directly to ground and the base of which is continuosly connected through a resistor to a positive pole of the voltage source and is connectable to ground through the sensor and a further resistor.

3. A testing instrument as defined by claim 2, wherein a contact electrode is connected to the constant-voltage source.

4. A testing instrument as defined by claim 3, wherein a Zener diode is disposed between the constant-voltage source and the contact electrode, the blocking voltage of the Zener diode being lower than the voltage of the constant-voltage source.

5. A testing instrument as defined by claim 3, wherein the contact electrode is disposed immediately adjacent the sensor.

6. A testing instrument as defined in claim 3, wherein the contact electrode is disposed on the sensor.

7. A testing instrument as defined in claim 1, wherein the sensor is a foil sensor.

8. A testing instrument as defined in claim 1, wherein the amplification factor of the amplifier circuit, when the sensor is closed, is at least $10^6$.

9. A testing instrument as defined in claim 8, further comprising a housing having an outer wall, and a copper plate disposed in the interior of the testing instrument on the outer wall of the housing, the copper plate being connected to the amplifier circuit via a high input resistor.

10. A testing instrument as defined in claim 9, further comprising a ground electrode connected to the constant voltage source.

11. An electrical multi-purpose measuring instrument having a constant-voltage source, comprising: a housing having an outer wall; a device for detecting alternating electromagnetic fields, said device including a copper plate disposed in the interior of the multi-purpose measuring instrument on the outer wall of the housing; an amplifier circuit connected to the copper plate via a high input resistor and having an amplification factor of at least $10^6$, and an LED connected to the constantvoltage source of the measuring instrument and controlled by the amplifier circuit.

12. A testing instrument as defined by claim 11, wherein a ground electrode is connected to the constant-voltage source.

13. A testing instrument for detecting alternating voltages in mains and alternating electromagnetic alternating fields in the vicinity of voltage-carrying conductors, said instrument comprising:

test prod means for probing said mains and the vicinity around said voltage-carrying conductors;
amplification means coupled to said test prod means for receiving and amplifying a signal received from said test prod means;
amplification reduction means coupled to said test prod means and said amplification means for reducing the amplification of said signal when said test prod means probes said mains; and
indicator means coupled to said amplification means for indicating the reception of said signal.

* * * * *

UNITED STATES PATENT AND TRADEMARK OFFICE
CERTIFICATE OF CORRECTION

PATENT NO. : 4,724,382

DATED : February 9, 1988

INVENTOR(S) : Hubertus Schauerte

It is certified that error appears in the above-identified patent and that said Letters Patent is hereby corrected as shown below:

In Figure 3, change "COOPER PLATE" to --COPPER PLATE--.

Signed and Sealed this

Twenty-fourth Day of May, 1988

Attest:

DONALD J. QUIGG

Attesting Officer

Commissioner of Patents and Trademarks